United States Patent
Basker et al.

(10) Patent No.: US 9,947,586 B2
(45) Date of Patent: Apr. 17, 2018

(54) TUNNELING FIN TYPE FIELD EFFECT TRANSISTOR WITH EPITAXIAL SOURCE AND DRAIN REGIONS

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/042,908

(22) Filed: Feb. 12, 2016

(65) Prior Publication Data
US 2017/0236755 A1   Aug. 17, 2017

(51) Int. Cl.
*H01L 29/165*   (2006.01)
*H01L 21/8234*   (2006.01)
(Continued)

(52) U.S. Cl.
CPC ............... *H01L 21/823431* (2013.01); *H01L 21/823425* (2013.01); *H01L 21/823468* (2013.01);
(Continued)

(58) Field of Classification Search
CPC ..... H01L 21/823431; H01L 21/823468; H01L 21/823425; H01L 29/785; H01L 29/0847;
(Continued)

(56) References Cited

U.S. PATENT DOCUMENTS 7,777,282 B2   8/2010   Majhi et al.
7,888,221 B2   2/2011   Kavalieros et al.
(Continued)

FOREIGN PATENT DOCUMENTS

CN   104134695 A   11/2014
CN   104347725 A   2/2015

OTHER PUBLICATIONS

Wang, P.-Y. et al., "SixGe1-x Epitaxial Tunnel Layer Structure for P-Channel Tunnel FET Improvement" IEEE Transactions on Electron Devices (2013) pp. 4098-4104, vol. 60, issue: 12.
(Continued)

*Primary Examiner* — Bo Fan
(74) *Attorney, Agent, or Firm* — Tutunjian & Bitetto, P.C.; Vazken Alexanian

(57) ABSTRACT

A method of forming semiconductor devices may begin with forming gate structures over fin structures on sidewalls of at least two mandrels. The mandrels are removed to provide gate structures having a first pitch and gate structure spacers having a second pitch. A first conductivity type epitaxial semiconductor material is formed on the exposed portions of the fin structures. Masking is formed in the first pitch space. The first conductivity type epitaxial semiconductor material is removed from a second space pitch. A second conductivity type epitaxial semiconductor material is formed in the second space pitch.

15 Claims, 10 Drawing Sheets

(51) Int. Cl.
*H01L 29/66* (2006.01)
*H01L 29/08* (2006.01)
*H01L 29/78* (2006.01)

(52) U.S. Cl.
CPC ........ *H01L 29/0847* (2013.01); *H01L 29/165* (2013.01); *H01L 29/6653* (2013.01); *H01L 29/66795* (2013.01); *H01L 29/785* (2013.01)

(58) Field of Classification Search
CPC ........... H01L 29/6653; H01L 29/66795; H01L 29/165
USPC ...................................................... 257/192
See application file for complete search history.

(56) References Cited

U.S. PATENT DOCUMENTS

| | | | |
|---|---|---|---|
| 8,569,152 B1 * | 10/2013 | Basker | H01L 29/66795 257/328 |
| 8,629,047 B2 | 1/2014 | Cheng et al. | |
| 8,697,536 B1 * | 4/2014 | Cheng | H01L 29/16 438/424 |
| 8,803,225 B2 | 8/2014 | Cui et al. | |
| 8,859,355 B1 * | 10/2014 | Leobandung | H01L 29/785 257/E21.703 |
| 8,946,029 B2 | 2/2015 | Wong et al. | |
| 8,957,478 B2 * | 2/2015 | He | H01L 27/0886 257/192 |
| 9,029,263 B1 * | 5/2015 | Kim | H01L 21/823437 257/E21.038 |
| 2003/0178670 A1 * | 9/2003 | Fried | H01L 21/28273 257/315 |
| 2010/0025766 A1 | 2/2010 | Nuttinck et al. | |
| 2012/0319167 A1 | 12/2012 | van Dal et al. | |
| 2013/0285138 A1 | 10/2013 | Vega et al. | |
| 2014/0054549 A1 | 2/2014 | Loh et al. | |
| 2015/0214345 A1 | 7/2015 | Wan et al. | |
| 2017/0125525 A1 | 5/2017 | Fung et al. | |
| 2017/0222021 A1 | 8/2017 | Mallela et al. | |

OTHER PUBLICATIONS

Hou, F.-J. et al., "32-nm Multigate Si-nTFET With Microwave-Annealed Abrupt Junction" IEEE Transactions on Electron Devices (2015) pp. 1-6, vol. PP, issue: 99.

* cited by examiner

TUNNELING FIN TYPE FIELD EFFECT TRANSISTOR WITH EPITAXIAL SOURCE AND DRAIN REGIONS

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming semiconductor device is provided in which the source and drain regions of the device are formed without requiring separate source and drain patterning and/or source and drain implantation to provide source and drain regions having opposite conductivities for producing a tunneling semiconductor device. In one embodiment, the method of forming the semiconductor device comprises forming gate structures on sidewalls for each of at least two mandrels, wherein the gate structures are formed over channel regions of at least one fin structure. The at least two mandrels are removed to provide two sets of exposed gate structures, a first set of gate structures having a first pitch and a second set of gate structure spacers having a second pitch. A first conductivity type epitaxial semiconductor material is formed on source and drain portions of the at least one fin structure. A masking is formed filling a first space between the adjacent set of gate structures having the first pitch. The first conductivity type epitaxial semiconductor material is removed from a second space between the second set of gate structure spacers having the second pitch. A second conductivity type epitaxial semiconductor material is formed in the second space.

In another embodiment, the method of forming the semiconductor device comprises forming at least two mandrels on at least one fin structure. Gate structure spacers are formed on sidewalls for each of the at least two mandrels. The at least two mandrels are removed to provide two sets of exposed gate structure spacers, a first set of gate structure spacers having a first pitch and a second set of gate structure spacers having a second pitch. A first conductivity type epitaxial semiconductor material is formed on source and drain portions of the at least one fin structure. A dielectric material is formed filling a first space between the adjacent set of gate structure spacers having the first pitch. The first conductivity type epitaxial semiconductor material is removed from a second space between the second set of gate structure spacers having the second pitch. A second conductivity type epitaxial semiconductor material is formed in the second space. The gate structure spacers are replaced with functional gate structures.

In another aspect of the present disclosure, a semiconductor device is provided that includes at least one fin structure, and a gate structure present on a channel portion of the fin structures. A first conductivity source region is formed on a source portion of the fin structures, wherein the first conductivity source region has a first length. A second conductivity drain region is formed on the drain portion of the fin structures, wherein the second conductivity drain region has a second length that is different from the first length.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
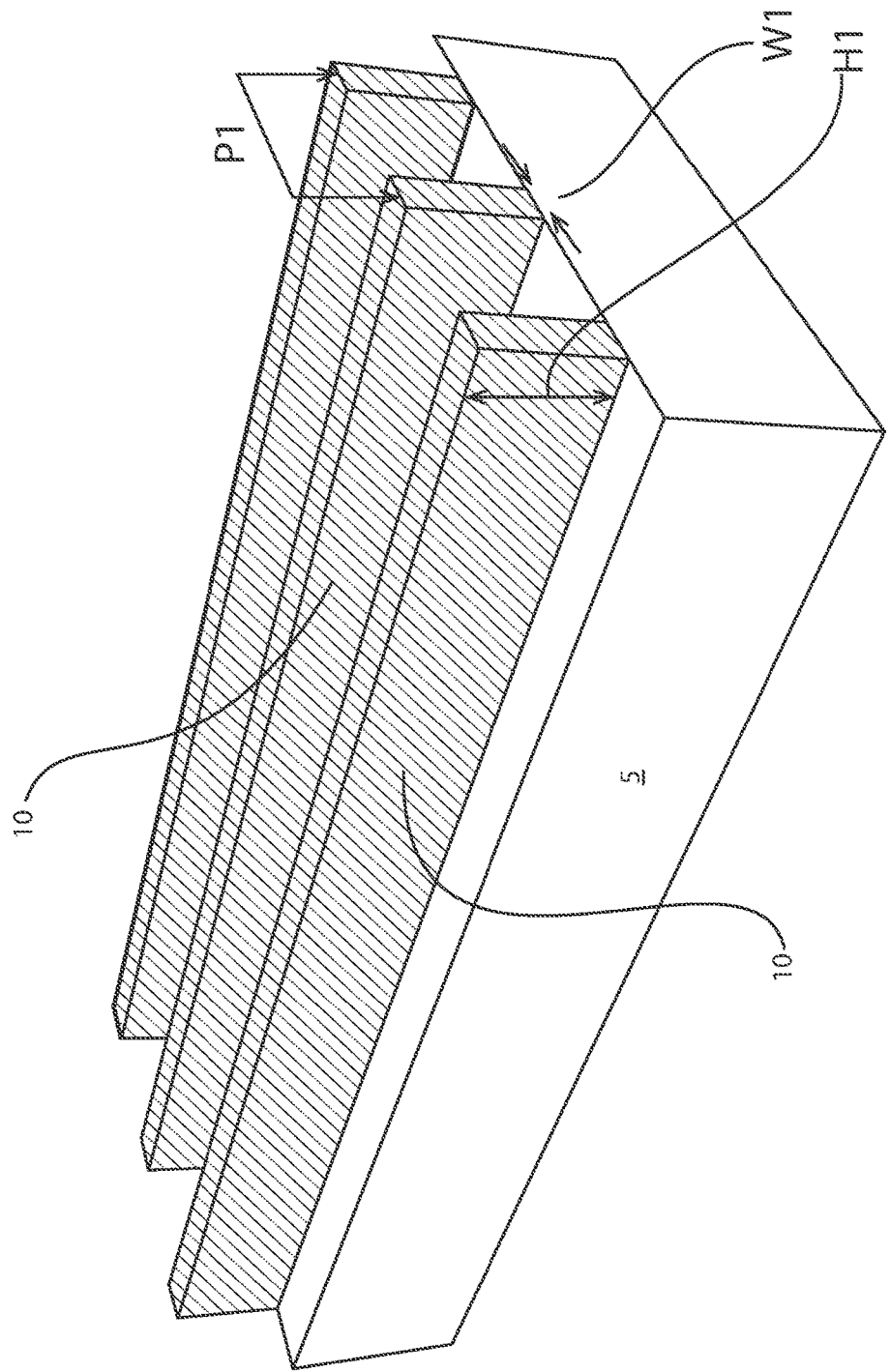
FIG. 1 is a perspective view that depicting a plurality of fin structures present on a substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The semiconductor devices disclosed herein employ fin structures. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. In some embodiments, the semiconductor devices that are disclosed herein are tunnel semiconductor devices. A "tunnel" semiconductor device employs source and drain regions that have opposing conductivity types. The term "conductivity type" denotes whether a semiconductor material is p-type or n-type. As will be discussed in greater detail below, in one embodiment, the tunnel semiconductor device may have a source region composed of an n-type semiconductor material and a drain region composed of a p-type semiconductor material. In another embodiment, the tunnel semiconductor device may have a source region composed of a p-type semiconductor material and a drain region composed of an n-type semiconductor material.

In some embodiments, the methods and structures disclosed herein provide tunneling semiconductor devices. Tunneling field effect transistors (FETs) are a candidate for future semiconductor logic device architecture. In some examples, its advantages over FinFET/planar FET are intrinsically better switching speed (SS), and scaling capability. In some embodiments, the methods and structures disclosed herein provide that the source and drain regions of the device are formed without requiring separate source and drain patterning and/or source and drain implantation to provide source and drain regions having opposite conductivities for producing the tunneling semiconductor device. Prior tunneling FETs typically have poor drive current, because of limited effective channel width (Weff) for band-to-band tunneling. Typically, prior tunneling FETs are either formed by ion implantation (this method does not work for short channel (SC) devices), or by employing separate patterning steps for the source and drain regions, which typically lead to increased cost and yield issues. The methods and structures disclosed herein can provide tunneling FET structures without requiring separate patterning (litho challenge) steps for forming each of the source and drain regions, and do not require source and drain ion implantation. In some examples, the tunneling FET devices disclosed herein potentially have high performance applications, e.g., if combined with 3D FinFET structures. The methods and structures of the present disclosure are now discussed with more detail referring to FIGS. 1-10.

FIG. 1 depicts a plurality of fin structures 10 present on a substrate 5. The fin structures 10 are composed of a semiconductor material which may be provided by the substrate 10. The substrate 5 may be a bulk semiconductor, or may be a semiconductor on insulator (SOI) substrate. In the example, in which the substrate 6 is a bulk substrate 5, an upper portion of the substrate 5 may be provide the material for the fin structures 10 that are defined by etching. Isolation between the adjacent fin structures 10 in this example can be provided by deposited dielectric material. In the embodiments in which the substrate 5 is an SOI substrate, the material for the fin structures 10 can be provided by the semiconductor on insulator (SOI) layer, wherein the underlying buried oxide layer of the SOI substrate provides for isolation between adjacent fin structures 10.

The fin structures 10 are typically formed using deposition, photolithography, i.e., patterning, and etch processes. In one embodiment, the patterning process used to define each of the fin structures 10 is a sidewall image transfer (SIT) process. The SIT process can include forming a first mandrel material layer (not shown) on the material layer that provides the fin structures 10, such as the SOI layer of an SOI substrate. The first mandrel material layer can include any material (semiconductor, dielectric or conductive) that can be selectively removed from the structure during a subsequently performed etching process. In one embodiment, the first mandrel material layer may be composed of amorphous silicon or polysilicon. In another embodiment, the first mandrel material layer may be composed of a metal, such as, e.g., aluminum (Al), tungsten (W), or copper (Cu). The first mandrel material layer can be formed by a deposition method, such as chemical vapor deposition or plasma enhanced chemical vapor deposition. In one embodiment, the thickness of the first mandrel material layer can be from 50 nm to 300 nm. Following deposition of the first mandrel material layer, the first mandrel material layer can be patterned by lithography and etching to form a plurality of first mandrel structures on the topmost surface of the semiconductor containing material that provides the fin structures 10, e.g., the SOI layer of an SOI substrate.

In some embodiments, the SIT process may continue by forming a dielectric spacer on each sidewall of each of the first mandrel structures. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10.

In some embodiments, after formation of the dielectric spacers, the SIT process continues by removing each the first mandrel structure. Each of the first mandrel structures can be removed by an etching process that is selective for removing the mandrel material as compared to semiconductor material of the substrate that provides the fin structures 10, e.g., silicon (Si). Following the first mandrel structure removal, the SIT process continues by transferring the pattern provided by the dielectric spacers into the semiconductor material layer that provides the fin structures 15, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. In some embodiments, the etch process may be an etch process including a chemistry that is selective to the dielectric layer 5 that is underlying the material layer that is patterned to provide the fin structures 15. The etching steps pattern the semiconductor material layer to provide the fin structures 15. Following etching, i.e., pattern transfer, the SIT process may conclude with removing the dielectric spacers using an etch process or a planarization process.

It is noted that the aforementioned spacer image transfer (SIT) process is only one method of forming the fin structures 10. In another embodiment, each of the fin structures 10 may be formed using a photoresist etch mask. Specifically, in one example, a photoresist mask is formed overlying the semiconductor composition layer which provides the fin structures 10. The exposed portions of the semiconductor layer that provides the fin structures 10 that are not protected by the photoresist mask are removed using a selective etch process. To provide the photoresist mask, a photoresist layer is first positioned on the semiconductor layer that provides the fin structure 10, e.g., SOI layer of an SOI substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 10, e.g., selectively etch the unprotected portions. The etch process may be an anisotropic process, such as reactive ion etch (RIE).

In some embodiments, each of the fin structures 10 may have a height H1 ranging from 5 nm to 200 nm. In another embodiment, each of the plurality of fin structures 10 has a height H1 ranging from 10 nm to 100 nm. In one example, each of the plurality of fin structures 10 has a height H1 ranging from 20 nm to 50 nm. Each of the plurality of fin structures 10 may have a width W1 of less than 20 nm. In another embodiment, each of the plurality of fin structures 10 has a width W1 ranging from 3 nm to 8 nm. Although three fin structures are depicted in FIG. 1, the present disclosure is not limited to only this example. It is noted that any number of fin structures 10 may be present on the substrate 5. The pitch P1 separating adjacent fin structures 10 may range from 10 nm to 500 nm. In another example, the pitch P1 separating adjacent fin structures in the plurality of fin structures 10 may range from 20 nm to 50 nm.

The fin structure 10 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. Typically, the semiconductor substrate 5 is composed of silicon (Si), e.g., single crystal silicon. One example of a compound semiconductor composition that may provide the fin structures 10 is a type III-V semiconductor. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used for the composition of the fin structures 10 include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

Figure 2:
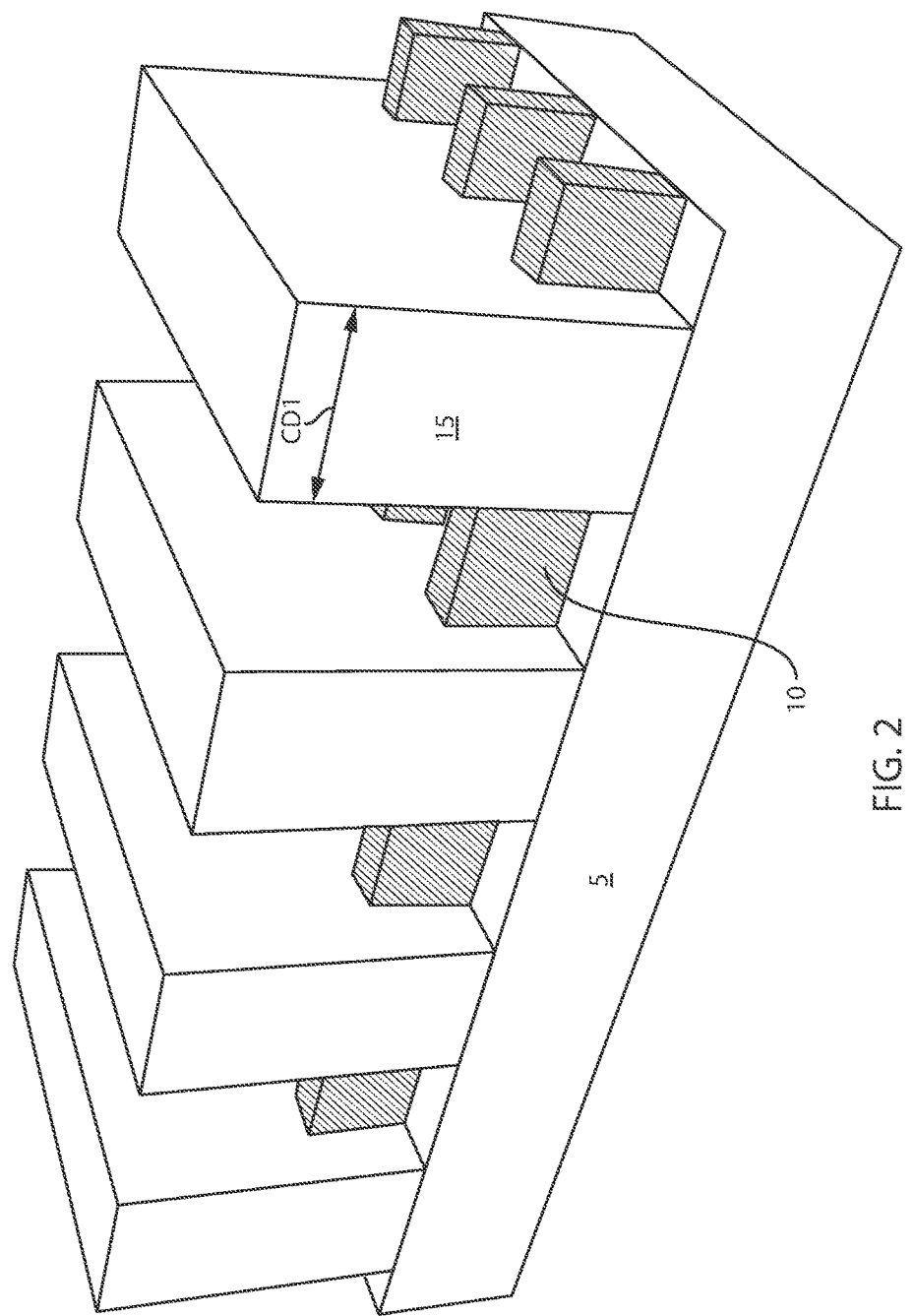
FIG. 2 is a perspective view depicting one embodiment of forming a plurality of mandrels on the fin structures depicted in FIG. 1, in accordance with one embodiment of the present disclosure.

FIG. 2 depicts one embodiment of forming a plurality of second mandrel structures 15 on the fin structures 10 depicted in FIG. 1. The mandrels 15 are typically composed of a dielectric material, but other material types may be equally applicable to the second mandrel structures 15 employed at this stage of the present disclosure. In one embodiment, the second mandrel structure 15 may be composed of amorphous silicon or polysilicon. In another embodiment, the second mandrel structure 15 may be composed of a dielectric, such as an oxide, e.g., silicon oxide; a nitride, e.g., silicon nitride; an oyxnitride; or a combination thereof.

It is noted that the dimensions of the second mandrel structure 15 may have a critical dimension (CD1) that substantially dictates the pitch of one set of gate structures 20 that is formed on the fin structures 10. As will be described below, in some embodiments, the gate structures 20 that are formed using the disclosed process flow using the second mandrel structure 15 may have at least two pitches. In some embodiments, the critical dimension (CD1) of the second mandrel structure 15 may range from 50 nm to 70 nm, and the pitch separating adjacent second mandrel structures 15 may range from 50 nm to 70 nm. In one example, the critical dimension (CD1) of the second mandrel structure 15 is equal to 60 nm, and the pitch separating the adjacent second mandrel structures 15 is equal to 60 nm.

The second mandrel structure 15 can be formed by a deposition method, such as chemical vapor deposition (CVD) or plasma enhanced chemical vapor deposition (PECVD), followed by an etch process. In one embodiment, the thickness of the first mandrel material layer can be from 50 nm to 300 nm. Following deposition of the material layer for the second mandrel structure 15, the material layer can be patterned by lithography and etching to form a plurality of second mandrel structures 15 overlying the fin structures 10. The lithography step may include forming a photoresist mask. To provide the photoresist mask, a photoresist layer is first positioned on the layer of the material that provides second mandrel structure 15. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the material that provides the second mandrel structure 15. For example, the transferring of the pattern provided by the photoresist into the underlying structures may include an anisotropic etch, such as reactive-ion etching (RIE). Other examples of anisotropic etching that can be used at this point of the present disclosure include ion beam etching, plasma etching or laser ablation. The etch process for defining the second mandrel structure 15 may be selective to the fin structures 10.

Figure 3:
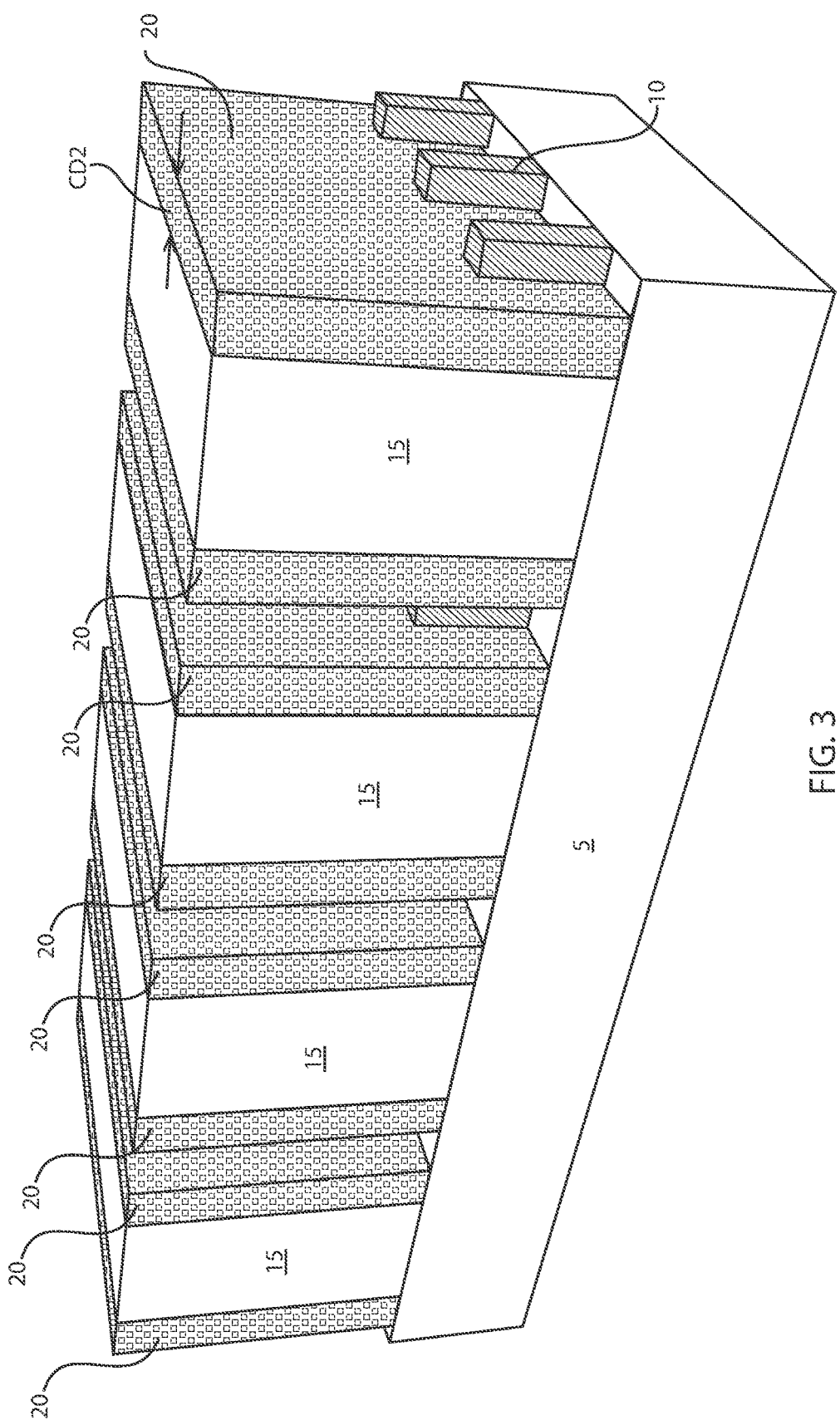
FIG. 3 is a perspective view depicting forming a gate structure spacer on sidewalls of the mandrels, in accordance with one embodiment of the present disclosure.

FIG. 3 depicts one embodiment of forming a gate structure spacer 20 on sidewalls of the second mandrel structures 15. The gate structure spacer 20 can be formed by deposition of a sacrificial gate material, and then etching the deposited sacrificial gate material. The sacrificial gate material may comprise any semiconductor or dielectric material. The sacrificial gate material selected for the gate structure spacer 20 is selected so that the second mandrel structure 15 may be removed by an etch that is selective to the gate structure spacer 20. The term "selective" as used to describe a material removal process denotes that the rate of material removal for a first material is greater than the rate of removal for at least another material of the structure to which the material removal process is being applied. For example, in some embodiments, in which the second mandrel structure 15 is composed of a dielectric material, the gate structure spacer 20 may be composed of a semiconductor material, such as silicon, monocrystalline silicon, polycrystalline silicon, amorphous silicon, or a combination thereof.

In some embodiments, the sacrificial gate material that is deposited for the gate structure spacer 20 may be deposited on at least the sidewalls of the second mandrel structure 15, as well as the upper surfaces of the second mandrel structures 15 and the exposed portions of the fin structures 10, using a conformal deposition process. The term "conformal" denotes a layer having a thickness that does not deviate from greater than or less than 30% of an average value for the thickness of the layer. Examples of deposition processes that can be used in providing the sacrificial layer for the gate structure spacer 20 include, but are not limited to, chemical vapor deposition (CVD), plasma enhanced chemical vapor deposition (PECVD), or atomic layer deposition (ALD).

Following deposition of the sacrificial gate material for the gate structure spacer 20, the horizontally orientate portions of the sacrificial gate material are removed using an anisotropic etch, wherein following the anisotropic etch, the remaining portions of the sacrificial gate material provides the gate structure spacer 20. As used herein, an "anisotropic etch process" denotes a material removal process in which the etch rate in the direction normal to the surface to be etched is greater than in the direction parallel to the surface to be etched. Examples of etching that be used in providing the gate structure spacers 20 include any etching process such as, e.g., reactive ion etching (RIE). Since the gate structure spacers 20 are used in the process as replacement/dummy gate structure, the width of the each gate structure spacer 20 determines the width of each subsequently formed functional gate structure.

In one embodiment, each of the gate structure spacers 20 has a critical dimension CD2 ranging from 5 nm to 35 nm. In another embodiment, each of the gate structures spacers 20 has a critical dimension CD2 ranging from 10 nm to 30 nm. In one example, each of the gate structure spacers 20 has a critical dimension CD2 of 20 nm.

Figure 4:
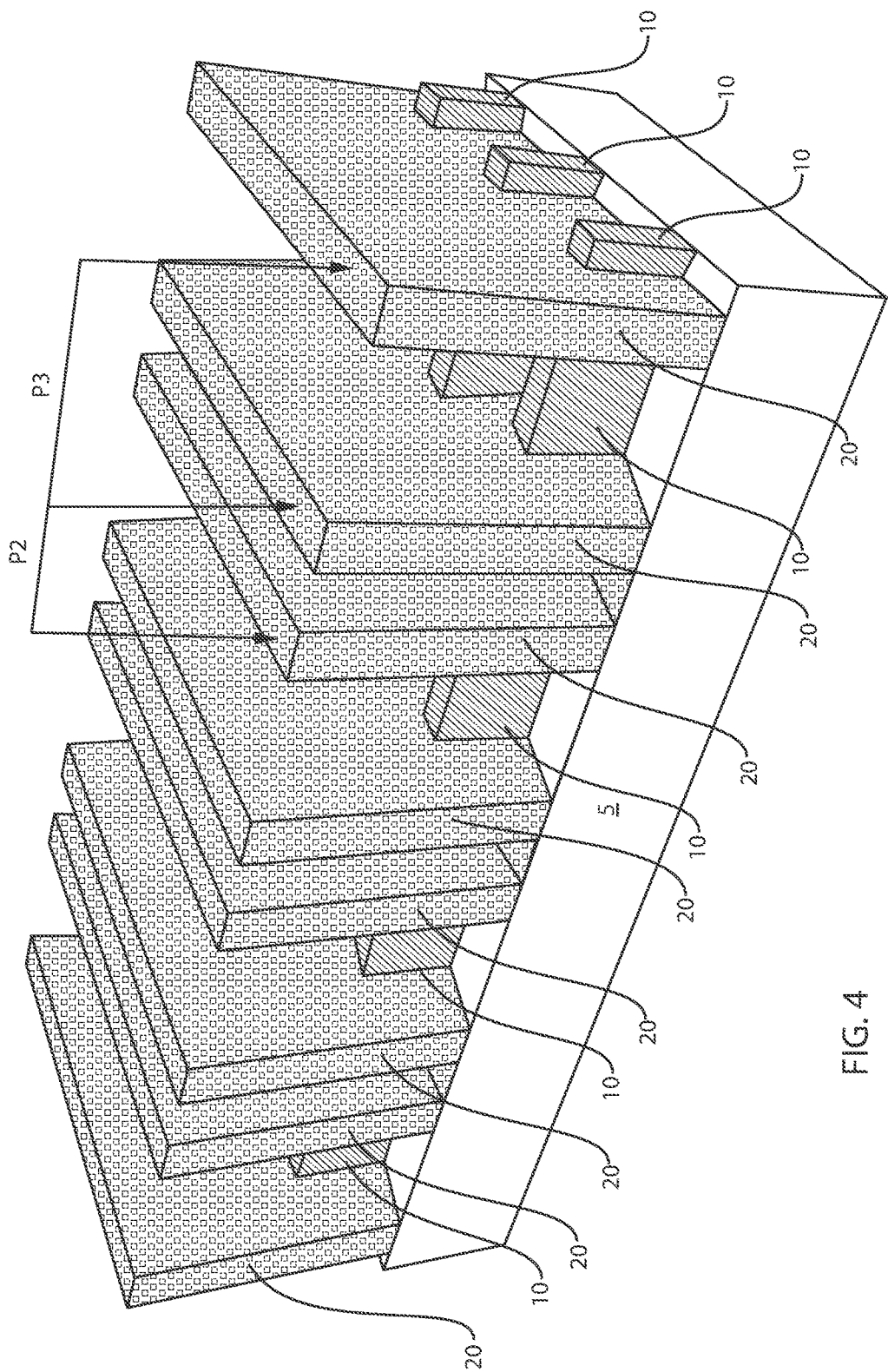
FIG. 4 is a perspective view depicting removing the plurality of mandrels, in accordance with one embodiment of the present disclosure.

FIG. 4 depicts one embodiment of removing the plurality of second mandrel structures 15. Each of the second mandrel structures 15 can be removed by an etching process that is selective for removing the mandrel material as compared to semiconductor material of the fin structures 10, e.g., silicon (Si), and the material of the gate structure spacers 20, e.g., polysilicon. The removal of the second mandrel structures 15 may be achieved by utilizing at least one etching process that can include dry etching, such as reactive ion etching (RIE), plasma etching, ion beam etching or laser ablation, chemical wet etch processes or a combination thereof.

The gate structures spacers 20 depicted in FIG. 4 are separated by two pitches P2, P3, which may be referred to as a "pitch walk", i.e., a periodic small pitch P2 and large pitch P3 sequence. The small pitch P2, also referred to as first pitch, is defined by the space between adjacent gate structure spacers 20 that was formed on adjacent, i.e., separate, second mandrel structures 15. The large pitch P3, also referred to as second pitch, is defined by the spacer between the opposing gate structure spacers 20 formed on the opposite sidewalls of the same second mandrel structure 15. In one embodiment, the small pitch P2, i.e., first pitch, ranges from 10 nm to 60 nm; and the large pitch P3, i.e., second pitch, ranges from 50 nm to 110 nm. In another embodiment, the small pitch P2, i.e., first pitch, ranging from 15 nm to 50 nm; and the large pitch P3, i.e., second pitch, ranges from 60 nm to 100 nm.

Figure 5:
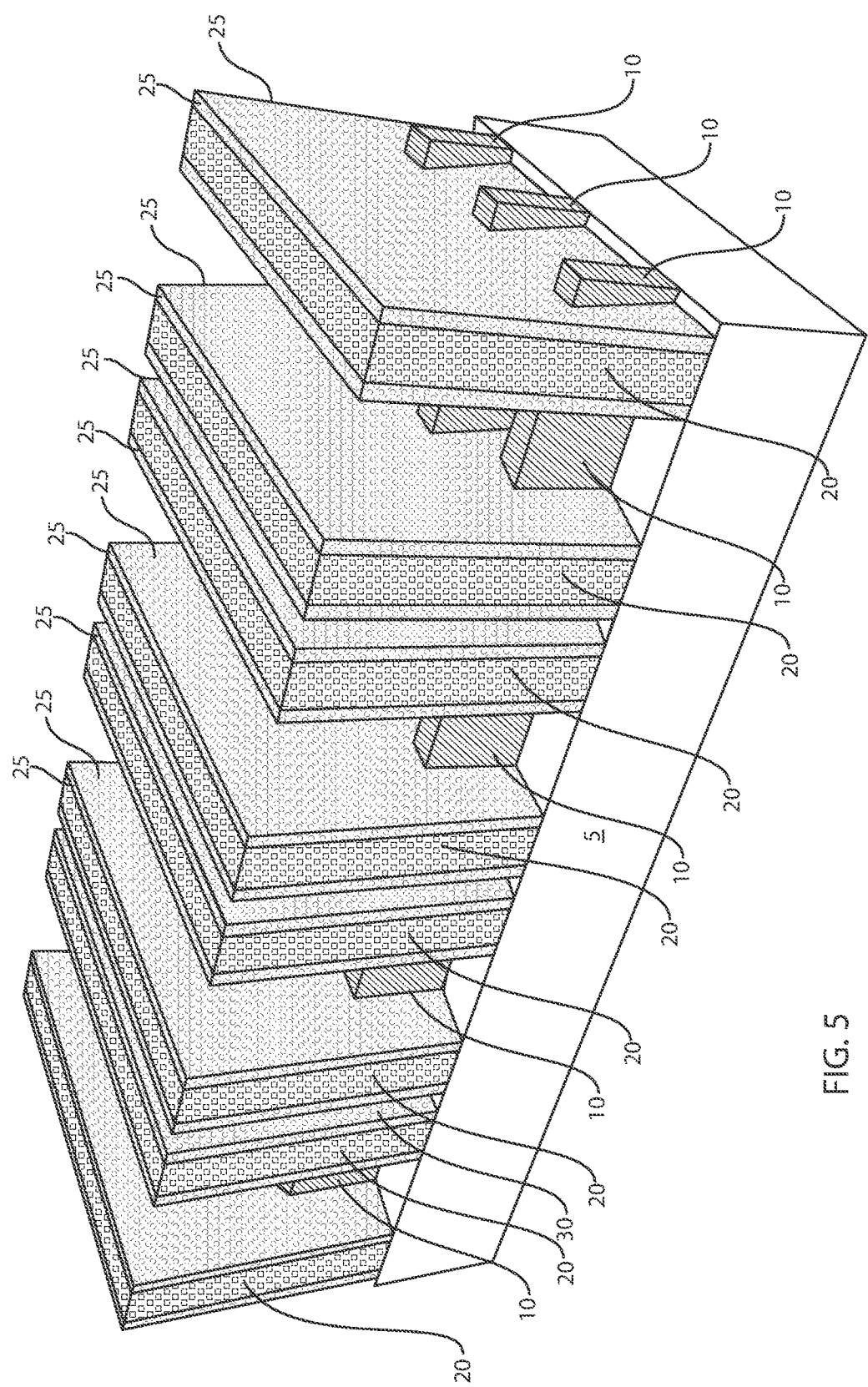
FIG. 5 is a perspective view depicting forming a gate sidewall spacers on the gate structure spacers, in accordance with one embodiment of the present disclosure.

FIG. 5 depicts forming gate sidewall spacers 25 on the gate structure spacers 20. The gate sidewall spacers 25 are typically composed of a dielectric material. In some embodiments, the gate sidewall spacers 25 may be composed of an oxide, nitride or oxynitride dielectric. For example, the gate sidewall spacers 25 can be composed of silicon nitride or a low-k dielectric, i.e., a dielectric material having a dielectric constant less than the dielectric constant of silicon oxide. In one embodiment, the gate sidewall spacers 25 may be formed by using a blanket layer deposition process, such as CVD, and an anisotropic etchback method. The gate sidewall spacers 25 may have a width ranging from 2.0 nm to 15.0 nm, and may be composed of a dielectric, such as a nitride, oxide, oxynitride, or a combination thereof.

Figure 6:
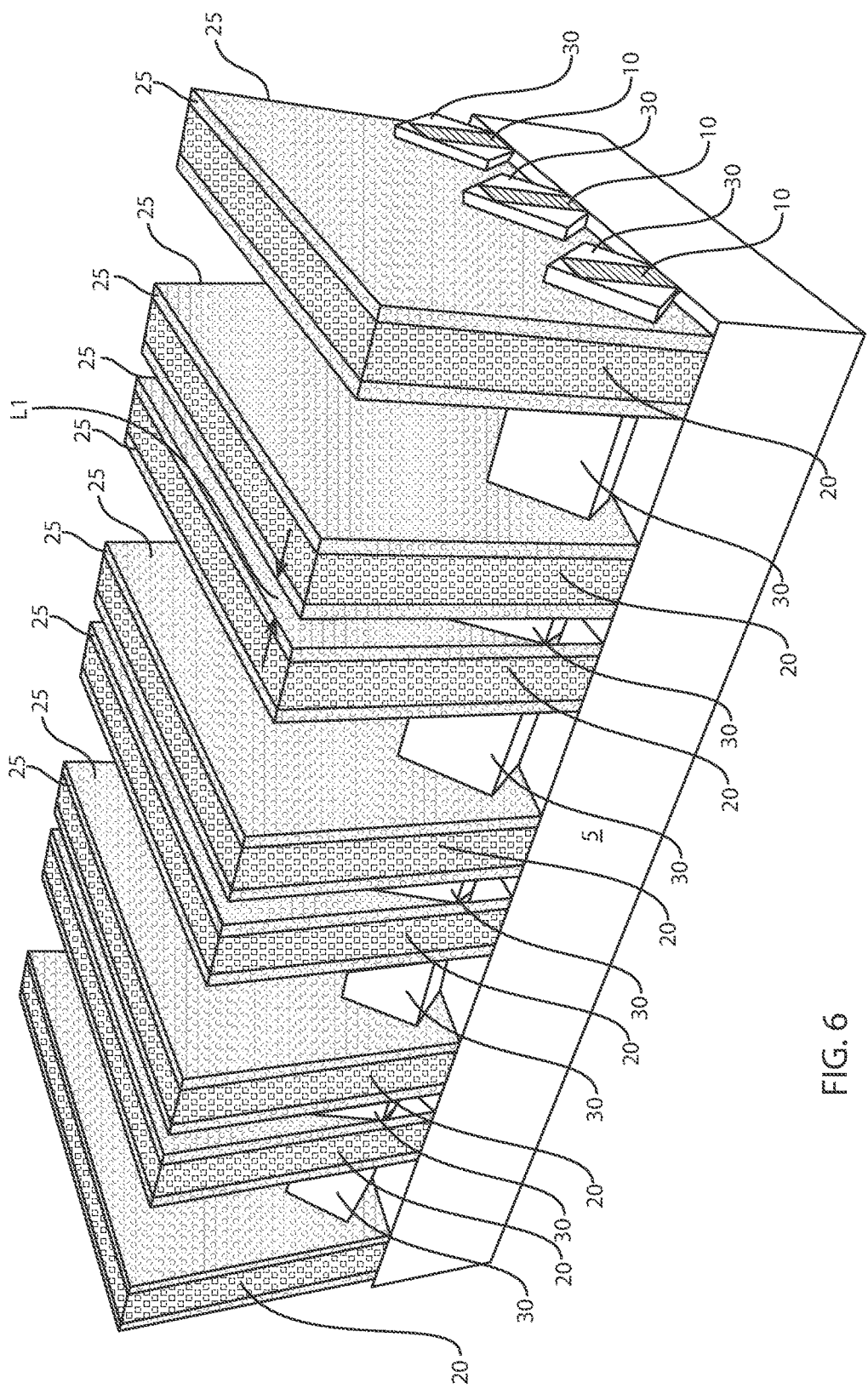
FIG. 6 is a perspective view depicting forming a first conductivity type epitaxial semiconductor material on source and drain portions of the at least one fin structure, in accordance with one embodiment of the present disclosure.

FIG. 6 depicts forming a first conductivity type epitaxial semiconductor material 30 on source and drain portions of the at least one fin structure 10. In the embodiment that is depicted in FIG. 6, the first conductivity type epitaxial semiconductor material 30 is a p-type conductivity material, and the n-type conductivity epitaxial semiconductor material for opposing source/drain region of the tunnel FinFET is formed at a later stage of the process sequence. It is noted that this is only one example of the methods and structures provided in the present disclosure, and it is not intended that the present disclosure is limited to only this example. For example, in some other embodiments, the first conductivity type epitaxial semiconductor material 30 is an n-type conductivity material, and the p-type conductivity epitaxial semiconductor material for opposing source/drain region is formed at a later stage of the process sequence.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., plasma enhanced chemical vapor deposition (PECVD), metal organic chemical vapor deposition (MOCVD).

The first conductivity type epitaxial semiconductor material 30 provides the doped semiconductor material of one of the source region and the drain region for the tunnel FinFET. The tunnel FinFET includes a source region and a drain region having opposite conductivity types. The opposite conductivity type of a p-type dopant is an n-type dopant, and the opposite conductivity type of an n-type dopant is a p-type dopant. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

The epitaxial deposition process for forming the first conductivity type epitaxial semiconductor material 30 is selective to forming epitaxial semiconductor material on semiconductor surfaces, such as the exposed surfaces of the fin structures 10. The first conductivity type epitaxial semiconductor material 30 may be formed on the fin structures 10 in the first space of the smaller pitch P2 between adjacent gate structure spacers 20, and the first conductivity type epitaxial semiconductor material 30 may be formed on the fin structures 10 in the second space of the larger pitch P3 between adjacent gate structure spacers 20. The first conductivity type epitaxial semiconductor material 30 is not deposited on dielectric surfaces such as the gate structure spacers 20 and the gate sidewall spacers 25.

In one example of the embodiment that is depicted in FIG. 2, the first conductivity type epitaxial semiconductor material 30 is composed of a silicon and germanium containing type IV semiconductor, e.g., silicon germanium (SiGe), that is doped with a p-type dopant, such as boron. It is noted that silicon germanium (SiGe) is only one example of a semiconductor material that may be employed for the composition of the first conductivity type epitaxial semiconductor material 30. Other semiconductor compositions may also be employed, such as silicon, germanium, silicon doped with carbon (Si:C), as well as compound semiconductors, such as type III-V semiconductor materials.

A number of different sources may be used for the epitaxial deposition of the first conductivity type epitaxial semiconductor material 30. In some embodiments, in which the semiconductor material that forms the first conductivity type epitaxial semiconductor material 30 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane ($(CH_3)SiH_3$), dimethylsilane ($(CH_3)_2SiH_2$), ethylsilane ($(CH_3CH_2)SiH_3$), methyldisilane ($(CH_3)Si_2H_5$), dimethyldisilane ($(CH_3)_2Si_2H_4$), hexamethyldisilane ($(CH_3)_6Si_2$) and combinations thereof. In some embodiments, in which the first conductivity type epitaxial semiconductor material 30 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the first conductivity type epitaxial semiconductor material 30 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The first conductivity type epitaxial semiconductor material 30 may be in-situ doped to provide the first conductivity type, e.g., p-type conductivity. By "in-situ" it is meant that the dopant e.g., n-type or p-type, that is being introduced to the epitaxial semiconductor material is introduced during the deposition step that forms the epitaxial semiconductor material. Referring to FIG. 6, when forming a first conductivity type epitaxial semiconductor material 30 that is p-type doped, in situ doping during the epitaxial deposition process may be provided by diborane gas.

In some embodiments, the thickness of the first conductivity type epitaxial semiconductor material 30 may range from 2 nm to 50 nm. In other embodiments, the thickness of the first conductivity type epitaxial semiconductor material 30 ranges from 5 nm to 25 nm.

Figure 7:
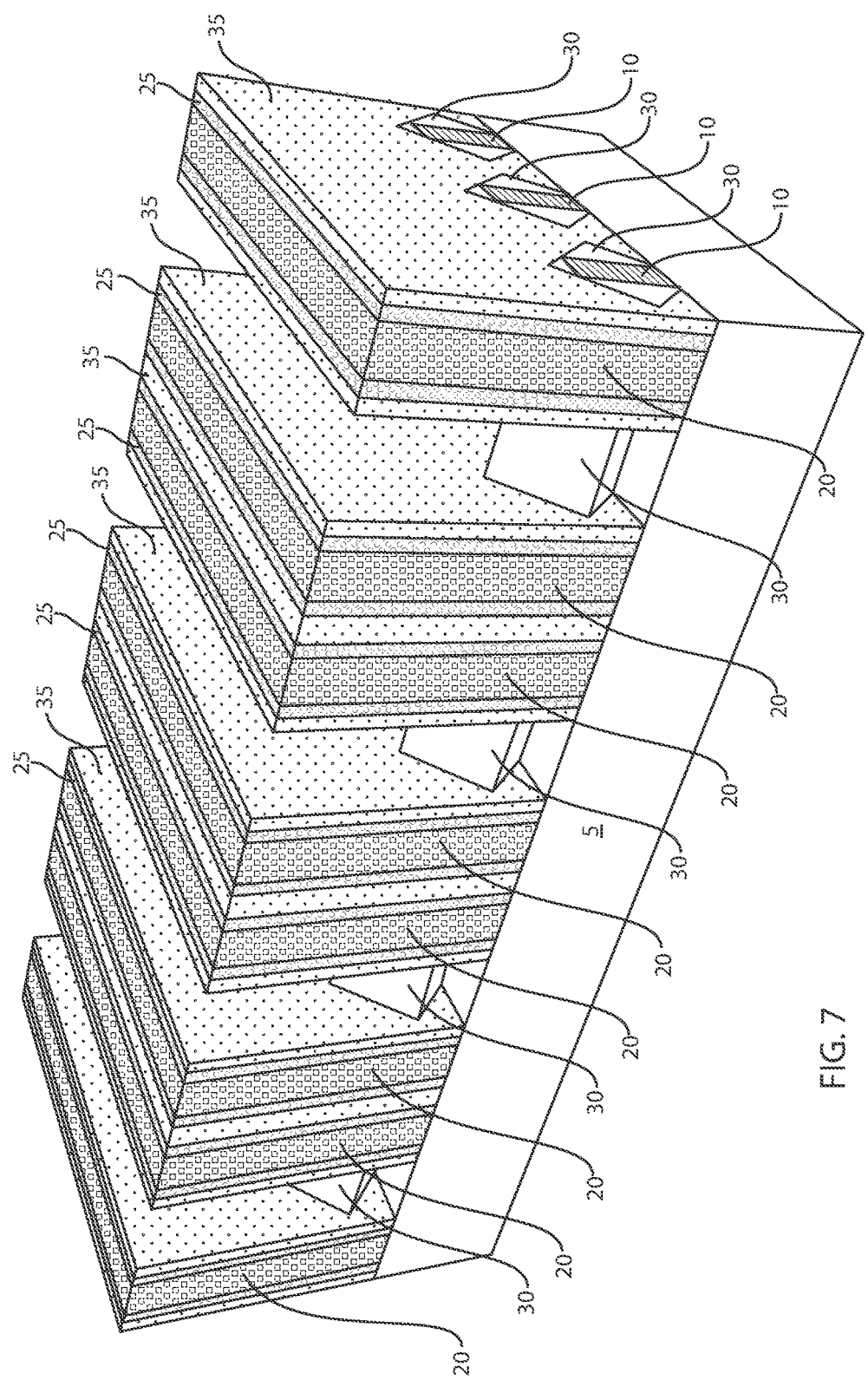
FIG. 7 is a perspective view depicting forming masking material filling a first space between the adjacent set of gate structures spacers having the first pitch, in accordance with one embodiment of the present disclosure.

FIG. 7 depicts forming masking material 35 filling a first space between the adjacent set of gate structures spacers having the smaller pitch P2, i.e., first pitch P2. The masking material 35 may be composed of a material that may be etched selectively to at least the first conductivity type epitaxial semiconductor material 30. In some embodiments, the masking material 35 may be an oxide, such as silicon oxide, nitride, such as silicon nitride, or a silicon oxynitride. In yet other examples, the masking material 35 can be composed of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), lanthanum aluminate ($LaAlO_3$), zirconium silicate ($ZrSiO_x$) and combinations thereof. It is noted that the above compositions are only examples of dielectric compositions that can be suitable for forming the masking material 35, and it is not intended that the present disclosure be limited to only those examples. Any material that is suitable for selective etching relative to the first conductivity type epitaxial semiconductor material 30 is suitable for use for the masking material 35 with the present disclosure.

Referring to FIG. 7, the masking material 35 may first be blanket deposited over the entirety of the structure depicted in FIG. 6. A blanket layer of masking material 35 may be deposited using chemical vapor deposition (CVD), such as plasma enhanced CVD (PECVD) or metal organic chemical vapor deposition (MOCVD). The blanket layer for the masking material 35 may also be formed using chemical solution deposition or physical vapor deposition. The masking material 35 may be deposited to a thickness that at least fills the first space between the gate structures 20 separated by the smaller pitch P2, i.e., first pitch P2. The portion of masking material 35 filling the space between the gate structure spacers 20 separated by the smaller pitch P2 cover the portions of the first conductivity type epitaxial semiconductor material 30 on the fin structures 10 present within the first space. The masking material 35 protects this portion of the first conductivity type epitaxial semiconductor material 30 from being removed by the subsequently described etch process for removing the portion of the first conductivity type semiconductor material 30 that is present in the space between the gate structure spacers 20 separated by the larger pitch P3.

FIG. 7 depicts patterning the blanket layer of the masking material 35 to be present only in the first space between the adjacent gate structure spacers 20 having the smaller pitch P2, i.e., first pitch P2, wherein the portion of the blanket layer of the masking material 35 that was present in the second space between the adjacent gate structures spacers 20 having the larger pitch, i.e., second pitch P3, has been removed by etching. In this example, the portion of the first conductivity type epitaxial semiconductor material 30 that is present in the second space between the adjacent gate structures spacers 20 having the larger pitch, i.e., second pitch P3, is exposed, while the portion of the first conductivity type epitaxial semiconductor material 30 that is present in the first space between the adjacent gate structure spacers 20 having the smaller pitch, i.e., first pitch P2, are protected by the remaining portion of the masking material 35.

In one embodiment, an etch mask (not shown), e.g., photoresist mask, may be formed on the portions of the blanket layer of the masking material 35 that is present in the first space between the adjacent gate structure spacers 20 having the smaller pitch, i.e., first pitch P2, wherein the remaining portions of the blanket layer of masking material 35 are exposed. To provide the photoresist mask 25, a photoresist layer is first positioned on the blanket layer of the masking material 35. The photoresist layer may be provided by a blanket layer of photoresist material that is formed utilizing a deposition process such as, for example, chemical vapor deposition, plasma enhanced chemical vapor deposition, evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. The exposed portion of the blanket layer of masking material 35 may be etched using an etch process that is selective to at least the photoresist mask exposing the underlying first conductivity type epitaxial semiconductor material 30, wherein the portion of the first masking material 35 protected by the photoresist mask 25 remains in the first space between the adjacent gate structure spacers 20 having the smaller pitch, i.e., first pitch P2, as depicted in FIG. 7.

Figure 8:
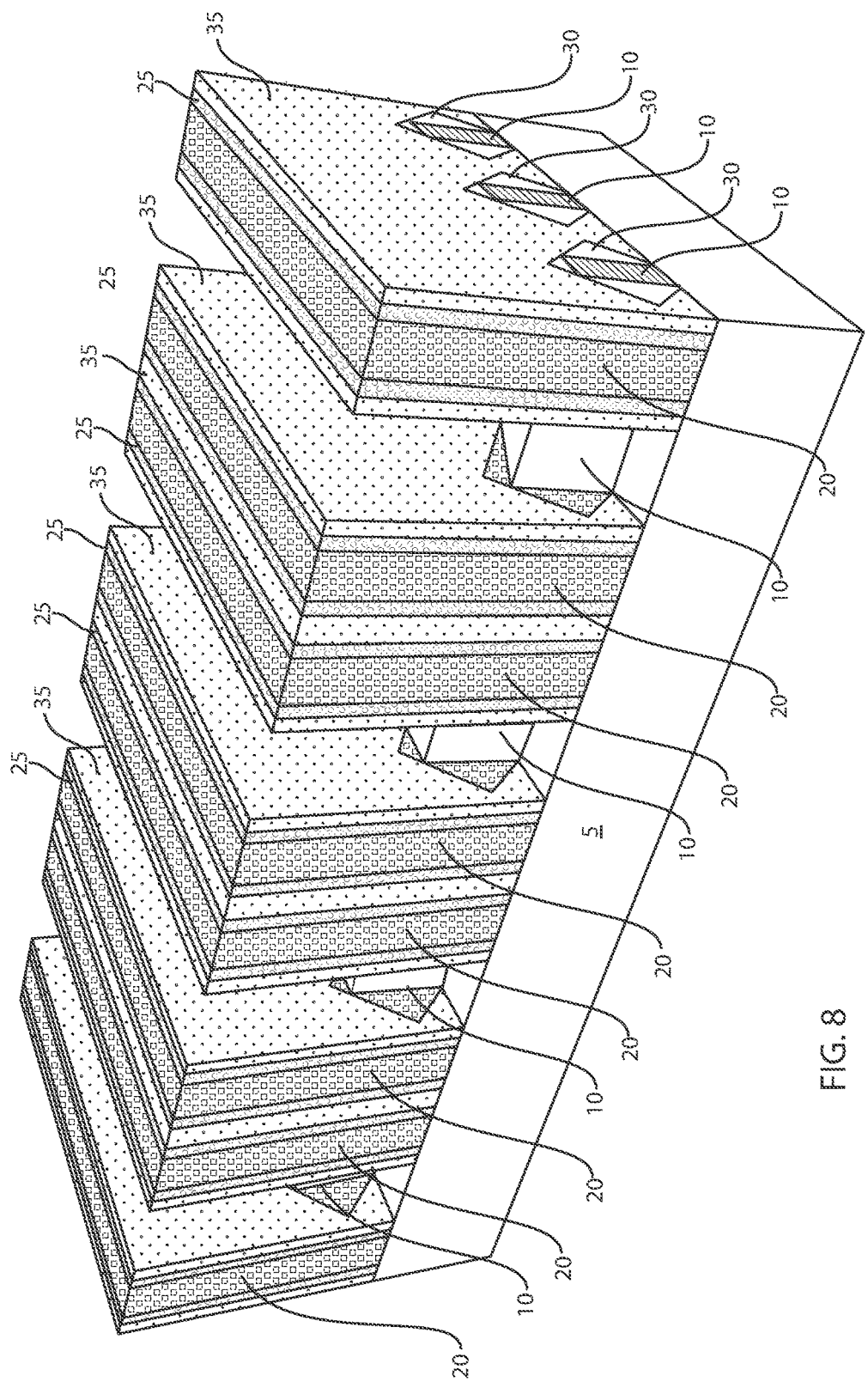
FIG. 8 is a perspective view depicting removing the first conductivity type epitaxial semiconductor material from a second space between the second set of gate structure spacers having the second pitch, in accordance with one embodiment of the present disclosure.

FIG. 8 depicts one embodiment of removing the first conductivity type epitaxial semiconductor material 30 from the second space between the second set of gate structure spacers 20 having the larger pitch P3, i.e., second pitch P3. Removing the first hard mask layer 20 from the second region 35 exposes the portion of the first doped oxide layer 15 that is present in the second region 35 of the substrate 5. The exposed portion of the first conductivity type epitaxial semiconductor material 30 that is present in the second space between the second set of gate structure spacers 20 having the larger pitch P3, i.e., second pitch P3, may be removed using an etch that is selective to at least one of the photoresist mask and the underlying fin structure 10. The etch process for removing the exposed portion of the first conductivity type epitaxial semiconductor material 30 may include reactive ion etch (RIE), plasma etching, ion beam etching or laser ablation/etching. Following removal of the first conductivity type epitaxial semiconductor material from the second space, the exterior surfaces of the fin structure 10 in the second space is exposed, and the photoresist mask may be removed.

Figure 9:
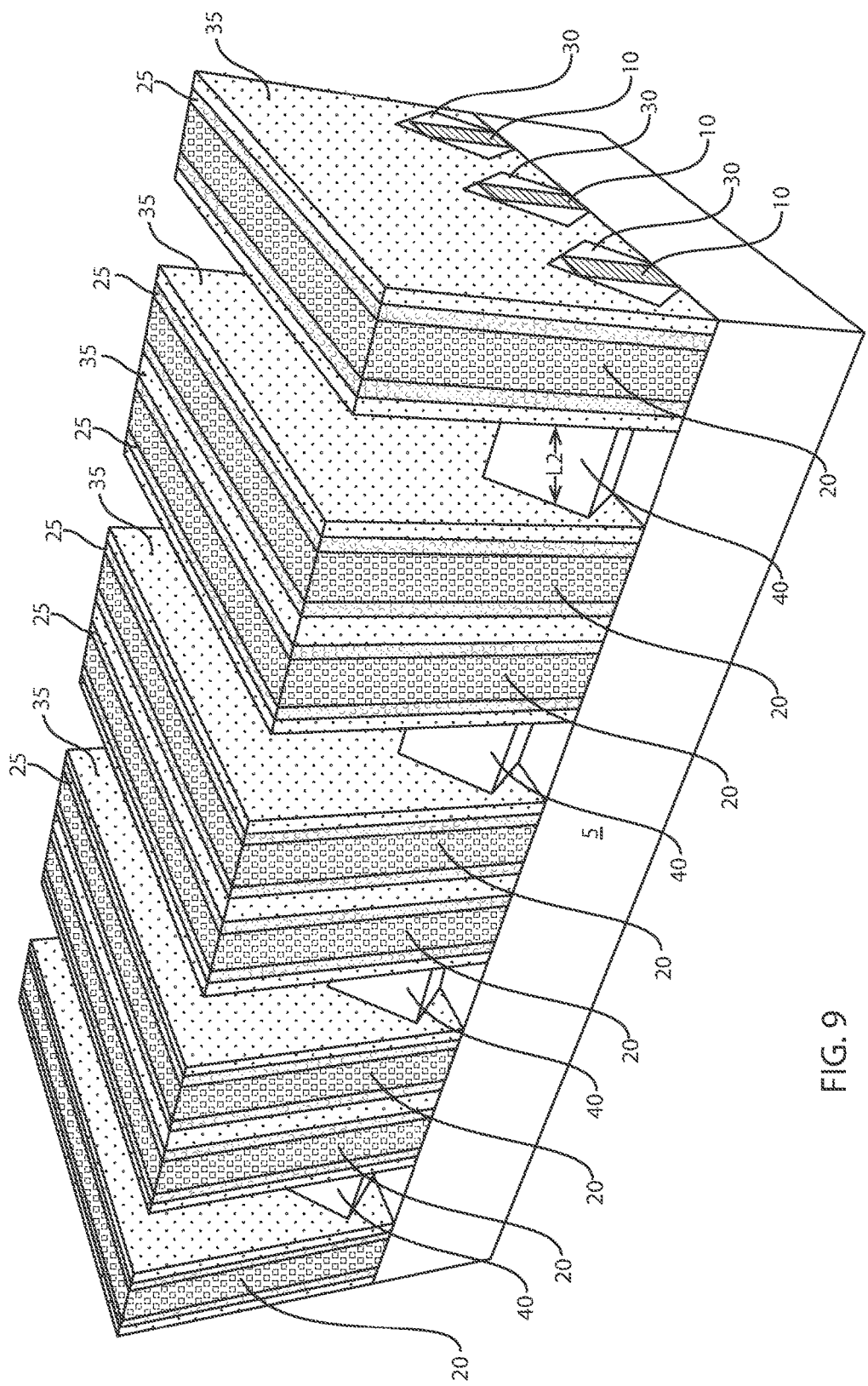
FIG. 9 is a perspective view depicting forming a second conductivity type epitaxial semiconductor material in the second space, in accordance with one embodiment of the present disclosure.

FIG. 9 depicts one embodiment of forming a second conductivity type epitaxial semiconductor material 40 in the second space between the second set of gate structure spacers 20 having the larger pitch P3, i.e., second pitch P3. The second conductivity type epitaxial semiconductor material 40 has a conductivity type that is opposite the conductivity type of the first conductivity type epitaxial semiconductor material 30. In one embodiment, if the first conductivity type epitaxial semiconductor material 30 that is present in the first space present between the gate structures 20 separated by the smaller pitch P2, i.e., first pitch, P2, is doped to a p-type conductivity, the second conductivity type epitaxial semiconductor material that is formed on the source/drain portions of the fin structures 10 in the second space between the second set of gate structure spacers 20 having the larger pitch P3, i.e., second pitch P3, has an n-type conductivity. In another embodiment, if the first conductivity type epitaxial semiconductor material 30 that is present in the first space present between the gate structures 20 separated by the smaller pitch P2, i.e., first pitch, P2, is doped to an n-type conductivity, the second conductivity type epitaxial semiconductor material that is formed on the source/drain portions of the fin structures 10 in the second space between the second set of gate structure spacers 20 having the larger pitch P3, i.e., second pitch P3, has a p-type conductivity.

In one embodiment, when the first conductivity type epitaxial semiconductor material 30 is composed of p-type silicon germanium, the second conductivity type epitaxial semiconductor material 40 is composed of n-type silicon, e.g., silicon in-situ doped with phosphorus. It is not intended that the composition of the second conductivity type epitaxial semiconductor material 40 be limited to only the aforementioned example. For example, the second conductivity type epitaxial semiconductor material 40 may be composed of silicon, monocrystalline silicon, polycrystalline silicon, germanium, silicon germanium, silicon germanium doped with carbon, silicon doped with carbon, and compound semiconductors, such as type III-V semiconductors and II-VI semiconductors, as well as combinations thereof. The n-type dopant may include one of antimony, arsenic and phosphorous.

The second conductivity type epitaxial semiconductor material 40 is formed using an epitaxial deposition and in-situ doping process similar to the first conductivity type epitaxial semiconductor material 30 that is described above with reference to FIG. 6. Similar to the epitaxial deposition for forming the first conductivity type epitaxial semiconductor material 30, the epitaxial deposition process for forming the second conductivity type epitaxial semiconductor material 40 is selectively deposits epitaxial material on semiconductor surfaces, and does not deposit epitaxial material on dielectric surfaces. Therefore, the second conductivity type epitaxial semiconductor material 40 is epitaxially formed on the exposed surfaces of the fin structures 10 that are present in the second space between the second set of gate structure spacers 20 having the larger pitch P3, i.e., second pitch P3; and the second conductivity type epitaxial semiconductor material 40 is obstructed from being formed on the remaining portion of the first conductivity type epitaxial semiconductor material 30 present in the first space between the second set of gate structure spacers 20 having the larger pitch P3, i.e., second pitch P3, by the masking material 35. Further details regarding epitaxial precursor gasses and epitaxial deposition conditions have been described above with reference to FIG. 6. The n-type gas dopant source for in-situ doping of the second conductivity type epitaxial semiconductor material 40 may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$).

The first and second conductivity type epitaxial semiconductor materials 30, 40 provided the source and drain regions of the tunnel FinFET. Because the first and second conductivity type epitaxial semiconductor materials 30, 40 are formed in the space between the two different pitches separating the gate structure spacers, the length of the first and second conductivity type epitaxial semiconductor materials 30, 40 are not equal.

In the example described with reference to FIGS. 1-8, the first conductivity type epitaxial semiconductor material 30 has a lesser length than the second conductivity type epitaxial semiconductor material 40. In one embodiment, the first conductivity type epitaxial semiconductor material 30 has a length L1 ranging from 5 nm to 20 nm, and the second conductivity type epitaxial semiconductor material 40 has a length L2 ranging from 20 nm to 60 nm. In another embodiment, the first conductivity type epitaxial semiconductor material 30 has a length L1 ranging from 5 nm to 10 nm, and the second conductivity type epitaxial semiconductor material 40 has a length L2 ranging from 20 nm to 40 nm. In yet another embodiment, the first conductivity type epitaxial semiconductor material 30 has a length L1 ranging from 5 nm to 15 nm, and the second conductivity type epitaxial semiconductor material 40 has a length L2 ranging from 40 nm to 60 nm.

Figure 10:
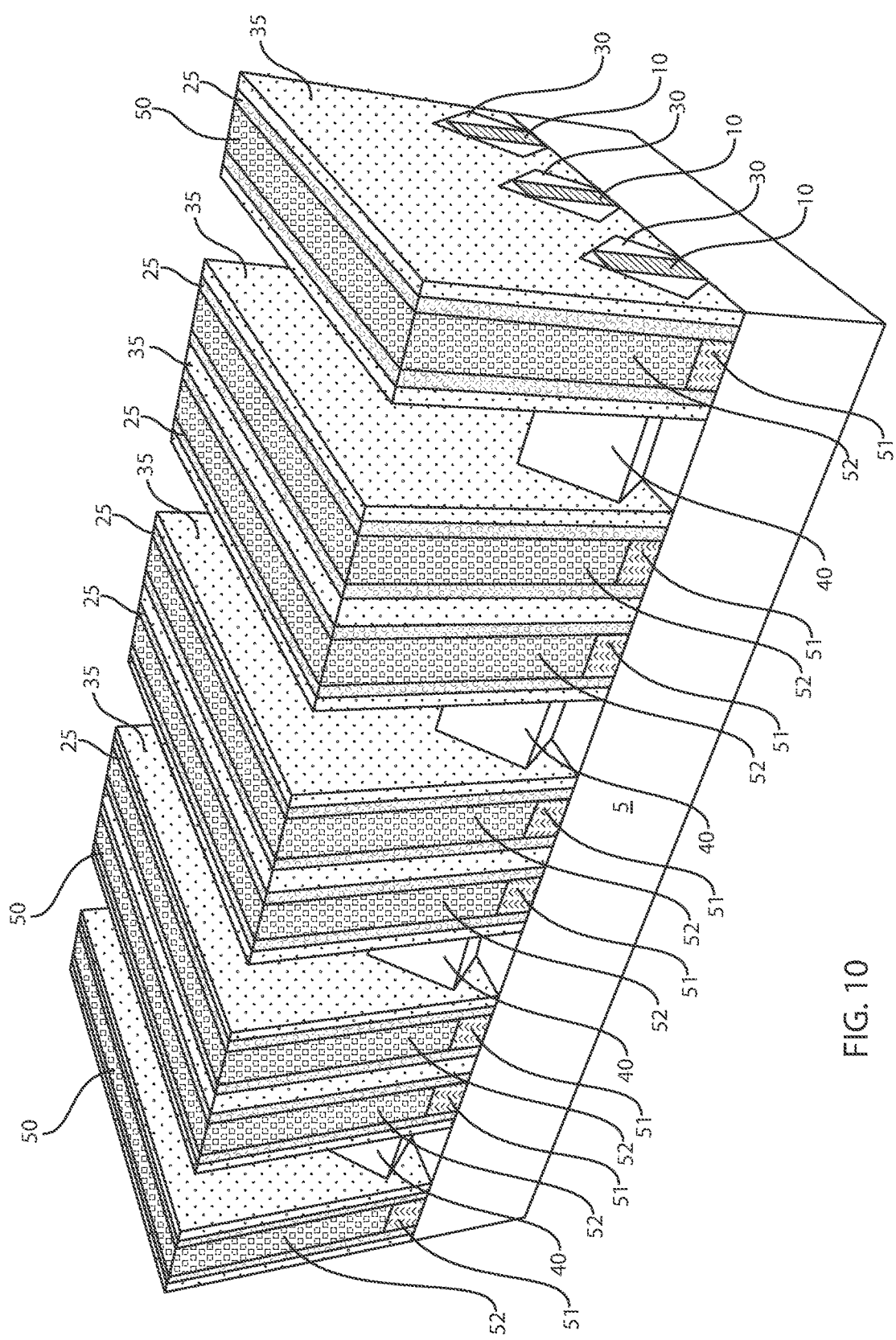
FIG. 10 is a perspective view depicting one embodiment of substituting functional gate structures for the gate structure spacers.

FIG. 10 depicts removing the gate structure spacers 20, and forming a functional gate structure 50 in the place of the gate structure spacers 20. In some embodiments, removing the gate structure spacers 20 may begin with forming an interlevel dielectric layer (not shown) on the structure depicted in FIG. 8, and planarizing the interlevel dielectric layer to expose an upper surface of the gate structure spacers 20. The gate structure spacers 20 may be removed using a wet or dry etch process. In one embodiment, the gate structure spacers 20 may be removed by at least one of an anisotropic etch process, such as reactive ion etch (RIE), or an isotropic etch process, such as a wet chemical etch. In one example, the etch process for removing the gate structure spacers 20 can include an etch chemistry for removing the gate structure spacers 20 selective to the fin structures 10.

FIG. 10 also depicts forming a functional gate structure 50 in the gate opening that is formed by removing the gate structure spacers 20. The functional gate structure 50 operates to switch the semiconductor device from an "on" to "off" state, and vice versa. The functional gate structure 50 may be formed by first depositing at least one gate dielectric 51 on the channel portion of the fin structures 10 of the semiconductor device followed by forming the at least one gate conductor 52 that is present on the at least one gate dielectric 51.

The at least gate dielectric may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The at least one gate dielectric 51 can be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation.

The conductive material of the at least one gate conductor 52 may comprise polysilicon, SiGe, a silicide, a metal or a metal-silicon-nitride such as Ta—Si—N. Examples of metals that can be used as the at least one gate conductor 52 include, but are not limited to, Al, W, Cu, and Ti or other like conductive metals. The layer of conductive material for the at least one gate conductor 52 may be doped or undoped. If doped, an in-situ doping deposition process may be employed. Alternatively, a doped conductive material can be formed by deposition, ion implantation and annealing. The at least one gate conductor 52 may be formed by using a deposition method, such as a chemical vapor deposition method and/or a physical vapor deposition (PVD).

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming a semiconductor device comprising:
   forming gate structures on sidewalls for each of at least two mandrels, wherein the gate structures are formed over channel regions of at least one fin structure;
   removing the at least two mandrels to provide two sets of exposed gate structures, a first set of gate structures having a first pitch and a second set of gate structure spacers having a second pitch;
   forming a first conductivity type epitaxial semiconductor material on source and drain portions of the at least one fin structure;
   forming masking filling a first space between adjacent gate structures having the first pitch;
   removing the first conductivity type epitaxial semiconductor material from a second space between the second set of gate structure spacers having the second pitch; and
   forming a second conductivity type epitaxial semiconductor material in the second space.

2. The method of claim 1, wherein forming the fin structures are formed using spacer image transfer.

3. The method of claim 1, wherein said forming the gate structures comprises:
   depositing a material layer for said at least two mandrels;
   forming an etch mask on the material layer, wherein a width of the etch mask dictates the first pitch;
   etching the material layer selectively to the etch mask to provide the at least two mandrels;
   depositing a conformal material layer for the gate structures on vertically orientated and horizontally orientated surfaces of the at least two mandrels; and
   etching the conformal material layer with an anisotropic etch, wherein remaining portions of the conformal material layer are present on the vertically orientated surfaces of the at least two mandrels to provide the gate structures.

4. The method of claim 3, wherein a space between adjacent gate structure formed on separate mandrels provides the first pitch.

5. The method of claim 1, wherein a width of a mandrel of said at least two mandrels provides the second pitch that is greater than the first pitch.

6. The method of claim 1 further comprising forming a gate sidewall spacer on sidewalls of the gate structures.

7. The method of claim 1, wherein said forming the first conductivity type epitaxial semiconductor material on the source and drain portions of the at least one fin structure provides p-type conductivity silicon and germanium containing material.

8. The method of claim 1, wherein said forming the masking filling the first space between the adjacent set of gate structures having the first pitch comprises depositing a dielectric material to pinch off the first space, and an etch process to remove the masking for the second space.

9. The method of claim 1, wherein said removing the first conductivity type epitaxial semiconductor material from the second space between the second set of gate structure spacers having the second pitch comprises selective etching.

10. The method of claim 1, wherein said second conductivity type epitaxial semiconductor material comprises an n-type silicon containing semiconductor material.

11. A method for forming the semiconductor device comprising:
    forming at least two mandrels on at least one fin structure;
    forming gate structure spacers on sidewalls for each of the at least two mandrels;
    removing the at least two mandrels to provide two sets of gate structure spacers, a first set of gate structure spacers having a first pitch and a second set of gate structure spacers having a second pitch;
    forming a first conductivity type epitaxial semiconductor material on source and drain portions of the at least one fin structure;
    forming a dielectric material filling a first space between the first set of gate structure spacers having the first pitch;
    removing the first conductivity type epitaxial semiconductor material from a second space between the second set of gate structure spacers having the second pitch;
    forming a second conductivity type epitaxial semiconductor material in the second space; and
    replacing the gate structure spacers with functional gate structures.

12. The method of claim 11, wherein said forming the gate structures comprises:
    depositing a material layer for said at least two mandrels;
    forming an etch mask on the material layer, wherein a width of the etch mask dictates the first pitch;
    etching the material layer selectively to the etch mask to provide the at least two mandrels;
    depositing a conformal material layer for the gate structures on vertically orientated and horizontally orientated surfaces of the at least two mandrels; and
    etching the conformal material layer with an anisotropic etch, wherein remaining portions of the conformal material layer are present on the vertically orientated surfaces of the at least two mandrels to provide the gate structures.

13. The method of claim 12, wherein a space between adjacent gate structure formed on separate mandrels provides the first pitch.

14. The method of claim 11, wherein a width of a mandrel of said at least two mandrels provides the second pitch that is greater than the first pitch.

15. The method of claim 11, wherein said forming the first conductivity type epitaxial semiconductor material on the source and drain portions of the at least one fin structure provides p-type conductivity silicon and germanium containing material, and said second conductivity type epitaxial semiconductor material comprises an n-type silicon containing semiconductor material.

* * * * *